(12) United States Patent
Obaru

(10) Patent No.: US 11,482,429 B2
(45) Date of Patent: Oct. 25, 2022

(54) SUBSTRATE PROCESSING APPARATUS AND SUBSTRATE PROCESSING METHOD

(71) Applicant: Tokyo Electron Limited, Tokyo (JP)

(72) Inventor: Takanori Obaru, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/093,767

(22) Filed: Nov. 10, 2020

(65) Prior Publication Data

US 2021/0159097 A1 May 27, 2021

(30) Foreign Application Priority Data

Nov. 21, 2019 (JP) .............................. JP2019-210647

(51) Int. Cl.
| | |
|---|---|
| *H01L 21/67* | (2006.01) |
| *H01L 21/687* | (2006.01) |
| *B08B 1/02* | (2006.01) |
| *B08B 1/00* | (2006.01) |
| *H01L 21/02* | (2006.01) |
| *B08B 15/04* | (2006.01) |

(52) U.S. Cl.
CPC ........ *H01L 21/67051* (2013.01); *B08B 1/001* (2013.01); *B08B 1/02* (2013.01); *B08B 15/04* (2013.01); *H01L 21/02057* (2013.01); *H01L 21/68742* (2013.01); *H01L 21/68764* (2013.01)

(58) Field of Classification Search
CPC ......... H01L 21/67051; H01L 21/68742; H01L 21/67046
See application file for complete search history.

(56) References Cited

U.S. PATENT DOCUMENTS

| | | | | |
|---|---|---|---|---|
| 8,997,764 | B2 * | 4/2015 | Puggl ................ | H01L 21/67034 134/99.1 |
| 2006/0090848 | A1 * | 5/2006 | Koga .................. | H01L 21/6715 250/492.1 |
| 2009/0202951 | A1 * | 8/2009 | Yamamoto ............... | B05D 5/06 134/198 |

FOREIGN PATENT DOCUMENTS

JP         2019-106531 A        6/2019

* cited by examiner

*Primary Examiner* — Natasha N Campbell
(74) *Attorney, Agent, or Firm* — Venjuris, P.C.

(57) ABSTRACT

A substrate processing apparatus includes: a holder that holds a substrate; a liquid supply that sequentially supplies a first processing liquid and a second processing liquid to a main surface of the substrate held by the holder; a friction body that comes into contact with and rub the main surface of the substrate during the supply of the first processing liquid and the second processing liquid; a mover that moves a contact position of the friction body in a first axial direction and a second axial direction; and a controller that controls the liquid supply and the mover to move the contact position of the friction body in one-side direction of the first axial direction during the supply of the first processing liquid, and move the contact position of the friction body in the other-side direction of the first axial direction during the supply of the second processing liquid.

19 Claims, 13 Drawing Sheets

SUBSTRATE PROCESSING APPARATUS AND SUBSTRATE PROCESSING METHOD

CROSS-REFERENCE TO RELATED APPLICATIONS

This application is based on and claims priority from Japanese Patent Application No. 2019-210647, filed on Nov. 21, 2019, with the Japan Patent Office, the disclosure of which is incorporated herein in its entirety by reference.

TECHNICAL FIELD

The present disclosure relates to a substrate processing apparatus and a substrate processing method.

BACKGROUND

The substrate processing apparatus described in Japanese Laid-Open Patent Publication No. 2019-106531 performs a carrying-in process and a lower surface cleaning process. In the carrying-in process, two adsorption pads hold the peripheral edge of the lower surface of the substrate. In the lower surface cleaning process, first, the adsorption pads that hold the substrate are moved in the positive direction of X-axis (FIG. 6 of Japanese Laid-Open Patent Publication No. 2019-106531), and subsequently, a cleaning body is pressed against the lower surface of the substrate (FIG. 7 of Japanese Laid-Open Patent Publication No. 2019-106531). Then, moving the two adsorption pads in the negative direction of X-axis and moving the cleaning body in the positive or negative direction of Y-axis between the two adsorption pads are alternately repeated (Japanese Laid-Open Patent Publication No. 2019-106531).

SUMMARY

According to an aspect of the present disclosure, a substrate processing apparatus includes: a holder configured to hold a substrate; a liquid supply configured to sequentially supply a first processing liquid and a second processing liquid different from the first processing liquid, to a main surface of the substrate held by the holder; a friction body configured to come into contact with and rub the main surface of the substrate during the supply of the first processing liquid and the second processing liquid; a mover configured to move a contact position of the friction body on the main surface of the substrate in a first axial direction and a second axial direction that are parallel with the main surface of the substrate and perpendicular to each other; and a controller configured to control the liquid supply and the mover to move the contact position of the friction body in one-side direction of the first axial direction during the supply of the first processing liquid, and move the contact position of the friction body in the other-side direction of the first axial direction during the supply of the second processing liquid that is subsequent to the supply of the first processing liquid.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
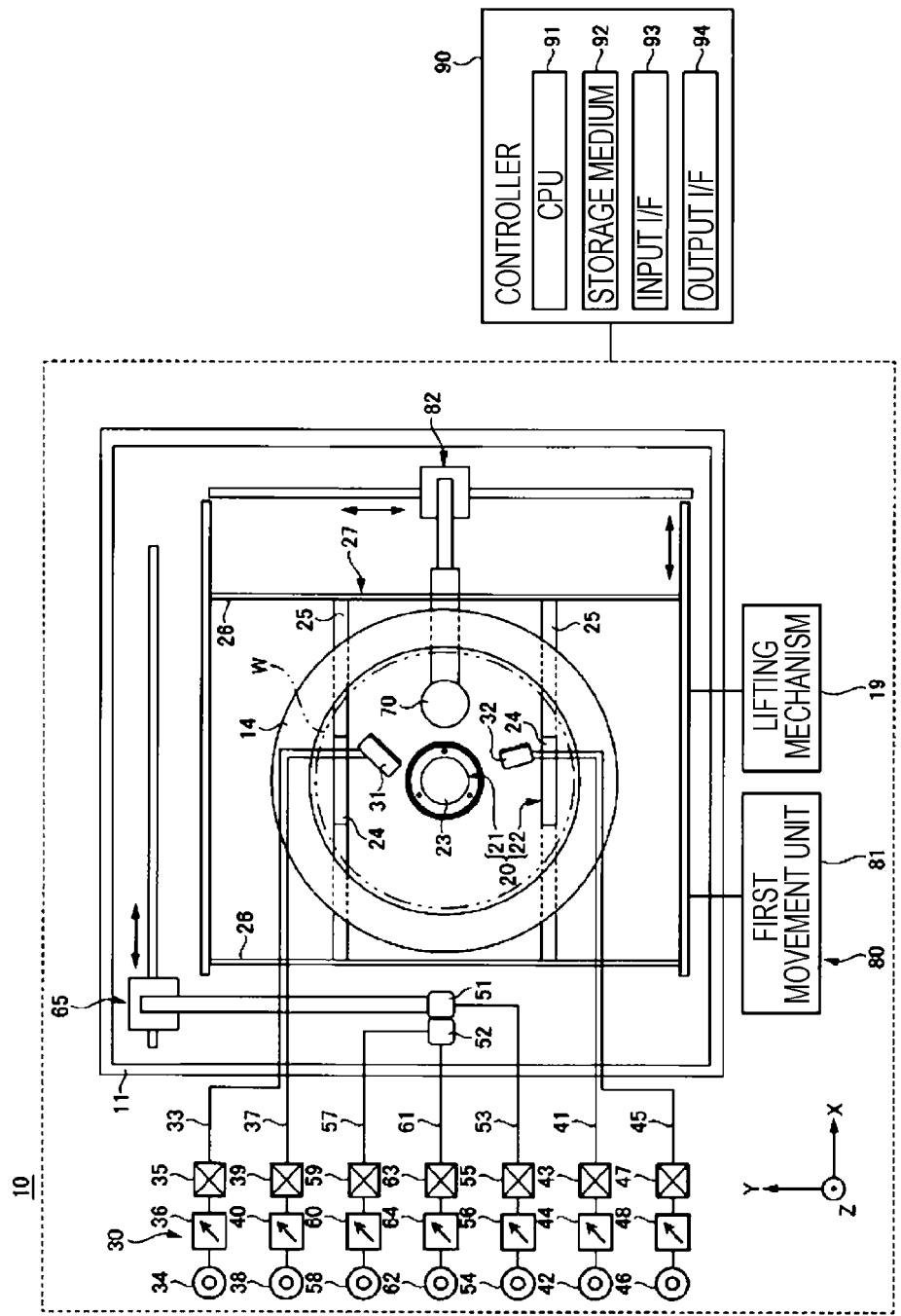
FIG. 1 is a plan view illustrating a substrate processing apparatus according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented herein.

Hereinafter, embodiments of the present disclosure will be described with reference to the accompanying drawings. In the respective drawings, similar or corresponding components will be denoted by the same reference numerals, and descriptions thereof may be omitted. In the descriptions herein, the X-axis direction, the Y-axis direction, and the Z-axis direction are perpendicular to each other. The X-axis direction and the Y-axis direction are horizontal directions, and the Z-axis direction is a vertical direction.

When a substrate W is held horizontally, the X-axis direction and the Y-axis direction are parallel to the main surface of the substrate W. The X-axis direction is the movement direction of a pair of adsorption pads 24, and the Y-axis direction is the movement direction of a friction body 70. The X-axis direction corresponds to a first axial direction, and the Y-axis direction corresponds to a second axial direction. The first axial direction and the second axial direction are perpendicular to each other in the present embodiment, but may obliquely intersect with each other.

As illustrated in FIG. 1, a substrate processing apparatus 10 includes a holder 20, a liquid supply 30, a friction body 70, a movement unit 80, and a controller 90. The holder 20 comes into contact with the lower surface of a substrate W to hold the substrate W horizontally. The liquid supply 30 sequentially supplies a first processing liquid and a second processing liquid different from the first processing liquid to the lower surface of the substrate W held by the holder 20. The friction body 70 comes into contact with the lower surface of the substrate W, and rubs the lower surface of the substrate W during the supply of the first processing liquid and the second processing liquid. The friction body 70 is capable of scrubbing the lower surface of the substrate W. The movement unit 80 relatively moves the holder 20 and the friction body 70 in the X-axis direction and the Y-axis direction, so as to move the contact position of the friction body 70 on the main surface of the substrate W. The controller 90 controls the liquid supply 30 and the movement unit 80 to process the lower surface of the substrate W.

Figure 6A:
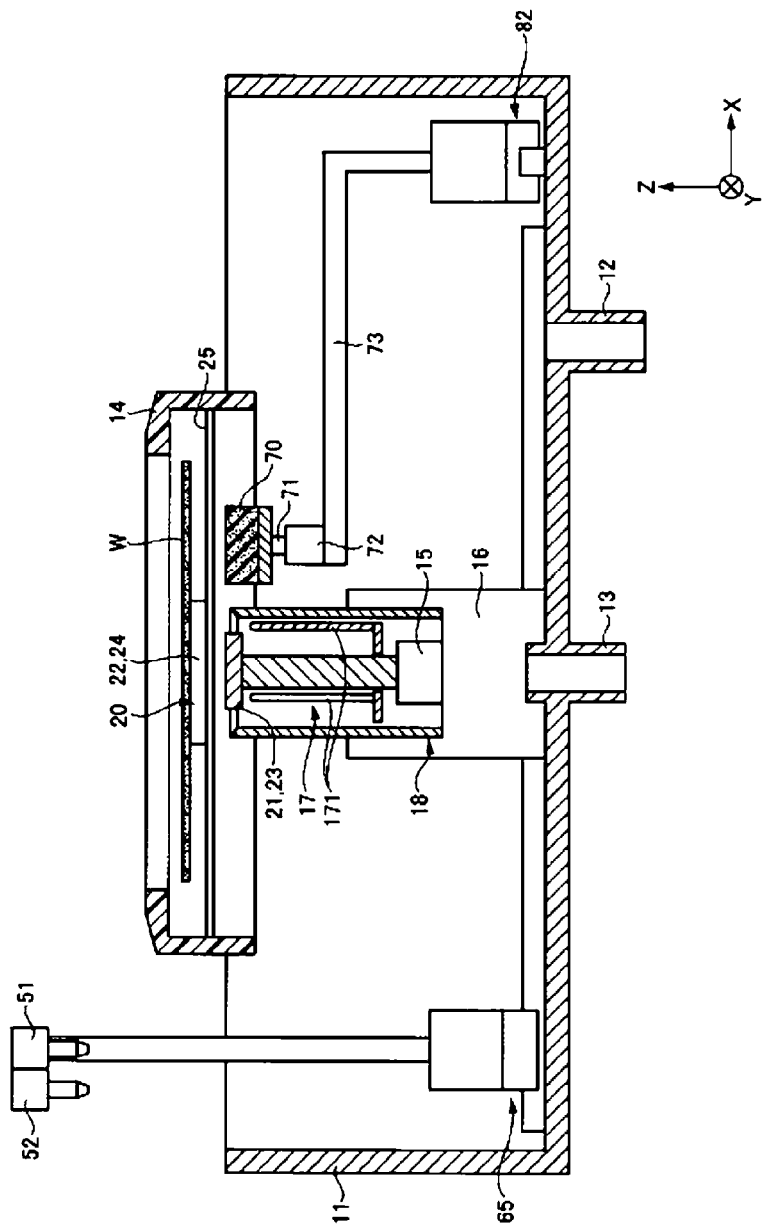
FIG. 6A is a cross-sectional view illustrating the substrate processing apparatus at the time when S1 of FIG. 3 is completed.

As illustrated in FIG. 6A, the holder 20 comes into contact with the lower surface of the substrate W, and holds the substrate W horizontally. The substrate W is, for example, a semiconductor substrate or a glass substrate. The semiconductor substrate is, for example, a silicon wafer or a compound semiconductor wafer. A device may be formed in advance on at least one of the lower surface and the upper surface of the substrate W. The device includes, for example, a semiconductor device, a circuit or a terminal. The holder 20 includes a first holder 21 and a second holder 22.

Figure 6B:
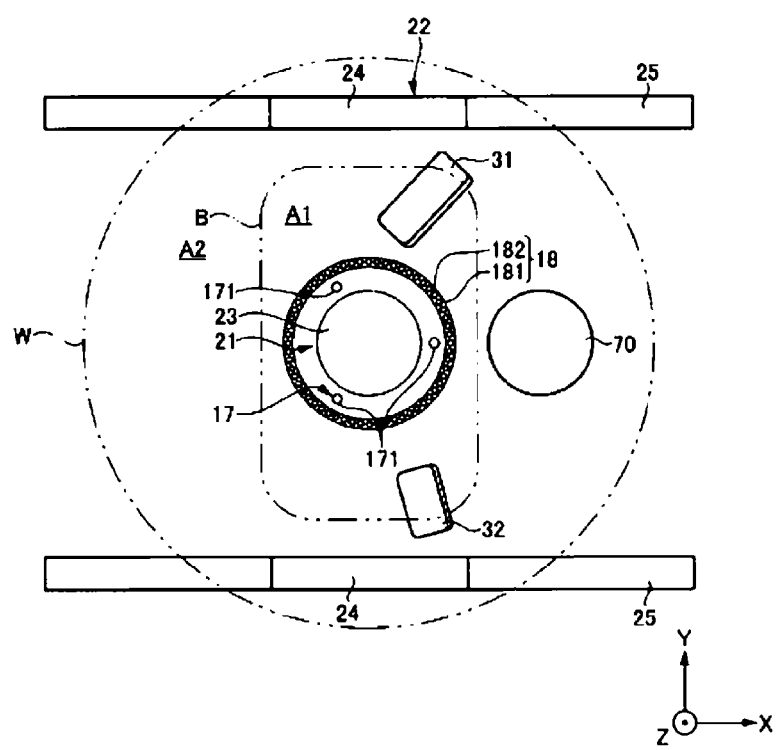
FIG. 6B is a plan view illustrating a portion of FIG. 6A when viewed through a substrate.

The first holder 21 adsorbs and holds a first area A1 of the lower surface of the substrate W illustrated in FIG. 6B. The first area A1 includes the center of the lower surface of the substrate W. A boundary B between the first area A1 and a second area A2 has, for example, a rectangular shape. The two sides of the rectangle are parallel to the X-axis direction, the remaining two sides of the rectangle are parallel to the Y-axis direction, and each of the four corners of the rectangle has an arc shape with the same radius as the radius of the upper surface of the friction body 70. The first holder 21 includes, for example, a spin chuck 23.

As illustrated in FIG. 6A, the spin chuck 23 is connected to a rotation mechanism 15. The rotation mechanism 15 rotates the spin chuck 23 around the vertical axis. The center line of the rotation is parallel to the Z-axis direction. The spin chuck 23 moves in the Z-axis direction by a lifting mechanism 16. Meanwhile, the spin chuck 23 does not move in the X-axis direction and the Y-axis direction.

A relay member 17 is disposed around the spin chuck 23. The relay member 17 includes, for example, a plurality of lifting pins 171, and the plurality of lifting pins 171 are arranged at equal intervals in the circumferential direction of the spin chuck 23. The relay member 17 moves up and down around the spin chuck 23, to receive the substrate W from a transfer device (not illustrated) and pass the received substrate W to the second holder 22.

Further, a gas ejection ring 18 is disposed around the spin chuck 23. The gas ejection ring 18 surrounds the spin chuck 23, and forms a ring-shaped gas curtain toward the lower surface of the substrate W. The gas curtain suppresses the first processing liquid and the second processing liquid from entering the gas curtain from the outside, so as to protect the spin chuck 23. The gas curtain also protects the relay member 17.

Figure 2:
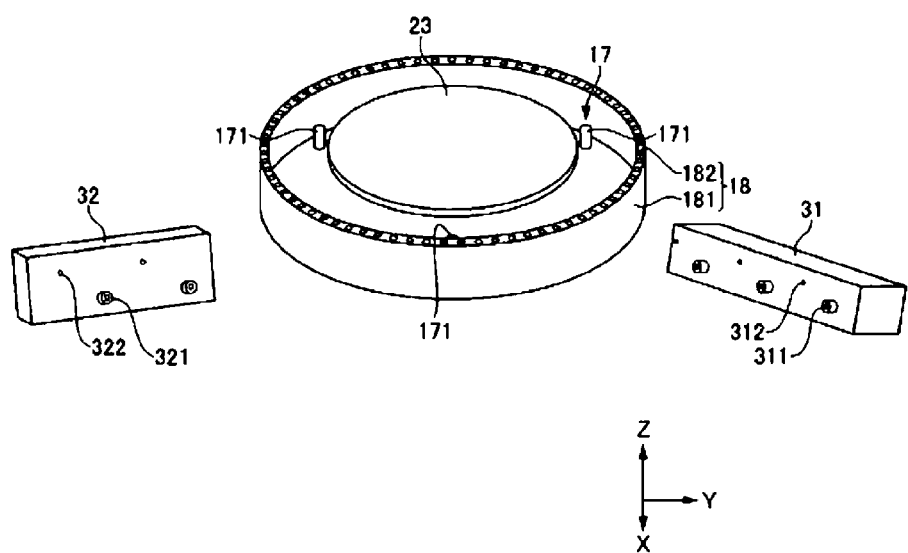
FIG. 2 is a perspective view illustrating a spin chuck, an air knife, and a liquid supply of FIG. 1.

As illustrated in FIGS. 2 and 6B, the gas ejection ring 18 includes a cylindrical body 181 and a plurality of ejection holes 182 arranged on the top surface of the cylindrical body 181 over the entire circumferential direction of the cylindrical body 181. The plurality of ejection holes 182 eject a gas directly upward to form the ring-shaped gas curtain. The gas is an inert gas such as nitrogen gas, or dry air.

The second holder 22 adsorbs and holds the second area A2 of the lower surface of the substrate W illustrated in FIG. 6B. The second area A2 includes the peripheral edge of the lower surface of the substrate W, and is in contact with the peripheral edge of the first area A1. The second holder 22 includes the pair of adsorption pads 24 arranged at an interval in the Y-axis direction.

As illustrated in FIG. 1, the pair of adsorption pads 24 are fixed to the centers of a pair of first bars 25 in the longitudinal directions thereof, respectively. The pair of first bars 25 are arranged such that the spin chuck 23 is disposed between the pair of first bars 25 and bridged between a pair of second bars 26. The pair of first bars 25 and the pair of second bars 26 form a square frame 27.

The frame 27 is connected to a first movement unit 81 of the movement unit 80. The first movement unit 81 moves the pair of adsorption pads 24 in the X-axis direction using the frame 27. Further, the frame 27 is connected to the lifting mechanism 19. The lifting mechanism 19 moves the pair of adsorption pads 24 in the Z-axis direction using the frame 27.

A ring cover 14 is fixed to the frame 27. The ring cover 14 surrounds the substrate W over the entire circumference of the substrate W, and suppresses the scattering of droplets from the substrate W. The ring cover 14 has an opening in the upper surface thereof, which is larger than the diameter of the substrate W. The opening is a passage of the substrate W.

The liquid supply 30 sequentially supplies the first processing liquid and the second processing liquid different from the first processing liquid to the lower surface of the substrate W held by the holder 20. The first processing liquid is a cleaning liquid for removing dirt on the substrate W, and is a chemical liquid such as SC1 (a mixed solution of ammonia, hydrogen peroxide, and water). The type of the chemical liquid is not specifically limited. The second processing liquid is a rinsing liquid for removing the first processing liquid, and is, for example, deionized water (DIW). The first processing liquid may not be a cleaning liquid, and may be an etching liquid or a peeling liquid. The second processing liquid may not be DIW, and may be diluted ammonia water or ozone water.

As illustrated in FIG. 2, the liquid supply 30 includes, for example, lower nozzles 31 and 32. When the friction body 70 rubs the first area A1 and the second area A2, the lower nozzle 31 supplies the chemical liquid or the rinsing liquid. Further, when the friction body 70 rubs the peripheral edge of the second area A2, the lower nozzle 32 supplies the chemical liquid or the rinsing liquid.

The lower nozzle 31 includes chemical liquid ejection holes 311 and rinsing liquid ejection holes 312. The chemical liquid ejection holes 311 are disposed below the rinsing liquid ejection holes 312. Accordingly, the chemical liquid may be suppressed from adhering to the rinsing liquid ejection holes 312. The number of chemical liquid ejection holes 311 is two or more, but may be one. Similarly, the number of rinsing liquid ejection holes 312 is two or more, but may be one.

As illustrated in FIG. 1, the lower nozzle 31 is connected to a chemical liquid supply source 34 via a pipe 33. An opening/closing valve 35 and a flow rate controller 36 are provided in the middle of the pipe 33. When the opening/closing valve 35 opens the flow path of the pipe 33, the chemical liquid is supplied from the chemical liquid supply source 34 to the lower nozzle 31, and ejected from the chemical liquid ejection holes 311. The flow rate controller 36 controls the ejection amount. When the opening/closing valve 35 closes the flow path of the pipe 33, the supply of the chemical liquid from the chemical liquid supply source 34 to the lower nozzle 31 is stopped, and the ejection of the chemical liquid is stopped.

Further, the lower nozzle 31 is connected to a rinsing liquid supply source 38 via a pipe 37. An opening/closing valve 39 and a flow rate controller 40 are provided in the middle of the pipe 37. When the opening/closing valve 39 opens the flow path of the pipe 37, the rinsing liquid is supplied from the rinsing liquid supply source 38 to the lower nozzle 31, and ejected from the rinsing liquid ejection holes 312. The flow rate controller 40 controls the ejection amount. When the opening/closing valve 39 closes the flow path of the pipe 37, the supply of the rinsing liquid from the rinsing liquid supply source 38 to the lower nozzle 31 is stopped, and the ejection of the rinsing liquid is stopped.

As illustrated in FIG. 2, similarly to the lower nozzle 31, the lower nozzle 32 includes chemical liquid ejection holes 321 and rinsing liquid ejection holes 322. Similarly to the lower nozzle 31, the lower nozzle 32 is connected to a chemical liquid supply source 42 via a pipe 41. An opening/closing valve 43 and a flow rate controller 44 are provided in the middle of the pipe 41. Further, the lower nozzle 32 is connected to a rinsing liquid supply source 46 via a pipe 45. An opening/closing valve 47 and a flow rate controller 48 are provided in the middle of the pipe 45.

The liquid supply 30 supplies a processing liquid to the upper surface of the substrate W held by the holder 20. As the processing liquid, for example, a rinsing liquid such as DIW is used. As the processing liquid, the chemical liquid and the rinsing liquid may be used in an order. As illustrated in, for example, FIG. 1, the liquid supply 30 includes, for example, upper nozzles 51 and 52.

The upper nozzle 51 supplies a processing liquid to the center of the upper surface of the substrate W during the rotation of the substrate W. The processing liquid wets and spreads over the entire upper surface of the substrate W by the centrifugal force, and is scattered from the peripheral edge of the substrate W. Similarly to the lower nozzle 31, the upper nozzle 51 is connected to a processing liquid supply source 54 via a pipe 53. An opening/closing valve 55 and a flow rate controller 56 are provided in the middle of the pipe 53.

The upper nozzle 52 moves in the diameter direction of the substrate W during the rotation of the substrate W, and supplies the processing liquid over the entire upper surface of the substrate W in the diameter direction thereof. The liquid supply 30 includes a movement device 65 that moves the upper nozzle 52 in the diameter direction of the substrate W. The upper nozzle 52 is a two-fluid nozzle, and pulverizes the processing liquid into fine particles with a gas such as $N_2$ gas, and sprays the particles. The processing efficiency of the processing liquid may be improved.

Similarly to the lower nozzle 31, the upper nozzle 52 is connected to a processing liquid supply source 58 via a pipe 57. An opening/closing valve 59 and a flow rate controller 60 are provided in the middle of the pipe 57. Further, the upper nozzle 52 is connected to a gas supply source 62 via a pipe 61. An opening/closing valve 63 and a flow rate controller 64 are provided in the middle of the pipe 61. When the opening/closing valve 63 opens the flow path of the pipe 61, a gas is supplied from the gas supply source 62 to the upper nozzle 52, and ejected from the upper nozzle 52. The flow rate controller 64 controls the ejection amount. When the opening/closing valve 63 closes the flow path of the pipe 61, the supply of the gas from the gas supply source 62 to the upper nozzle 52 is stopped, and the ejection of the gas is stopped.

The various types of processing liquids ejected from the liquid supply 30 are collected in a processing tank 11. The processing tank 11 has, for example, a box shape. As illustrated in, for example, FIG. 6A, a drainage pipe 12 for discharging a processing liquid and an exhaust pipe 13 for discharging a gas are provided in the bottom wall of the processing tank 11.

The friction body 70 comes into contact with the lower surface of the substrate W, and rubs the lower surface of the substrate W. The friction body 70 is a brush or a sponge. The friction body 70 has, for example, a cylindrical shape, and is disposed such that the upper surface thereof is horizontal. The upper surface of the friction body 70 is smaller than the lower surface of the substrate W. While the friction body 70 is disposed below the substrate W in the present embodiment, the friction body 70 may be disposed above the substrate W to rub the upper surface of the substrate W.

The friction body 70 is connected to a rotation motor 72 via a vertical rotary shaft 71. The rotation motor 72 rotates the friction body 70 around the rotary shaft 71. The rotation motor 72 is connected to a second movement unit 82 of the movement unit 80 via an arm 73. The second movement unit 82 moves the friction body 70 in the Y-axis direction. The second movement unit 82 further moves the friction body 70 in the Z-axis direction.

The movement unit 80 relatively moves the holder 20 and the friction body 70 in the X-axis direction and the Y-axis direction, so as to move the contact position of the friction body 70 on the lower surface of the substrate W. For example, the movement unit 80 includes the first movement unit 81 and the second movement unit 82. The first movement unit 81 moves the second holder 22 in the X-axis direction as described above. Meanwhile, the second movement unit 82 moves the friction body 70 in the Y-axis direction as described above.

The controller 90 is, for example, a computer, and includes a central processing unit (CPU) 91 and a storage medium 92 such as a memory as illustrated in FIG. 1. The storage medium 92 stores programs for controlling various processings that are performed in the substrate processing apparatus 10. The controller 90 causes the CPU 91 to execute the programs stored in the storage medium 92, so as to control the operation of the substrate processing apparatus 10. Further, the controller 90 includes an input interface 93 and an output interface 94. The controller 90 receives a signal from the outside through the input interface 93, and transmits a signal to the outside through the output interface 94.

The programs are stored in, for example, a computer-readable storage medium, and installed from the storage medium in the storage medium 92 of the controller 90. The computer-readable storage medium may be, for example, a hard disc (HD), a flexible disc (FD), a compact disc (CD), a magnet optical disc (MO) or a memory card. The programs may be downloaded from a server through the Internet, and installed in the storage medium 92 of the controller 90.

Figure 3:
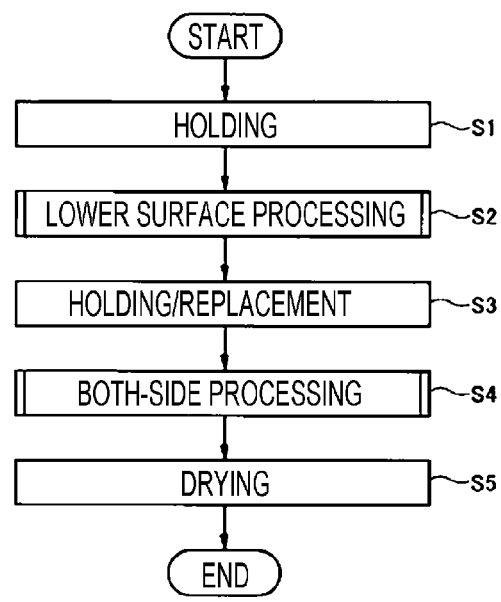
FIG. 3 is a flowchart illustrating a substrate processing method according to an embodiment.

Next, the operation of the substrate processing apparatus 10, that is, a substrate processing method will be described with reference to, for example, FIG. 3. As illustrated in FIG. 3, the substrate processing method includes S1 for holding, S2 for a lower surface processing, S3 for holding/replacement, S4 for a both-side processing, and S5 for drying. This processing method is performed under the control of the controller 90.

In S1 for the holding, the second holder 22 holds the substrate W. Specifically, first, a transfer device (not illustrated) transfers the substrate W above the spin chuck 23, and stands by. Subsequently, the relay member 17 moves up around the spin chuck 23, and projects upward from the opening of the ring cover 14 to lift the substrate W from the transfer device. Subsequently, when the transfer device exits from the substrate processing apparatus 10, the movement unit 80 moves the ring cover 14 and the pair of adsorption pads 24 upward. Then, the relay member 17 moves down, and passes the substrate W to the pair of adsorption pads 24. Subsequently, the pair of adsorption pads 24 adsorb and hold the second area A2 of the lower surface of the substrate W. As described above, the second area A2 includes the peripheral edge of the lower surface of the substrate W, and is in contact with the peripheral edge of the first area A1.

Figure 4:
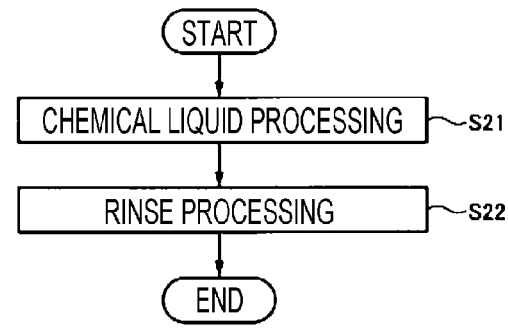
FIG. 4 is a flowchart illustrating an example of S2 of FIG. 3.

In S2 for a lower surface processing, the friction body 70 rubs the first area A1 of the lower surface of the substrate W in a state where the second holder 22 holds the substrate W. As described above, the first area A1 includes the center of the lower surface of the substrate W, and indicates the area between the pair of adsorption pads 24. As illustrated in FIG. 4, S2 for the lower surface processing includes S21 for a chemical liquid processing and S22 for a rinsing liquid processing.

Figure 7A:
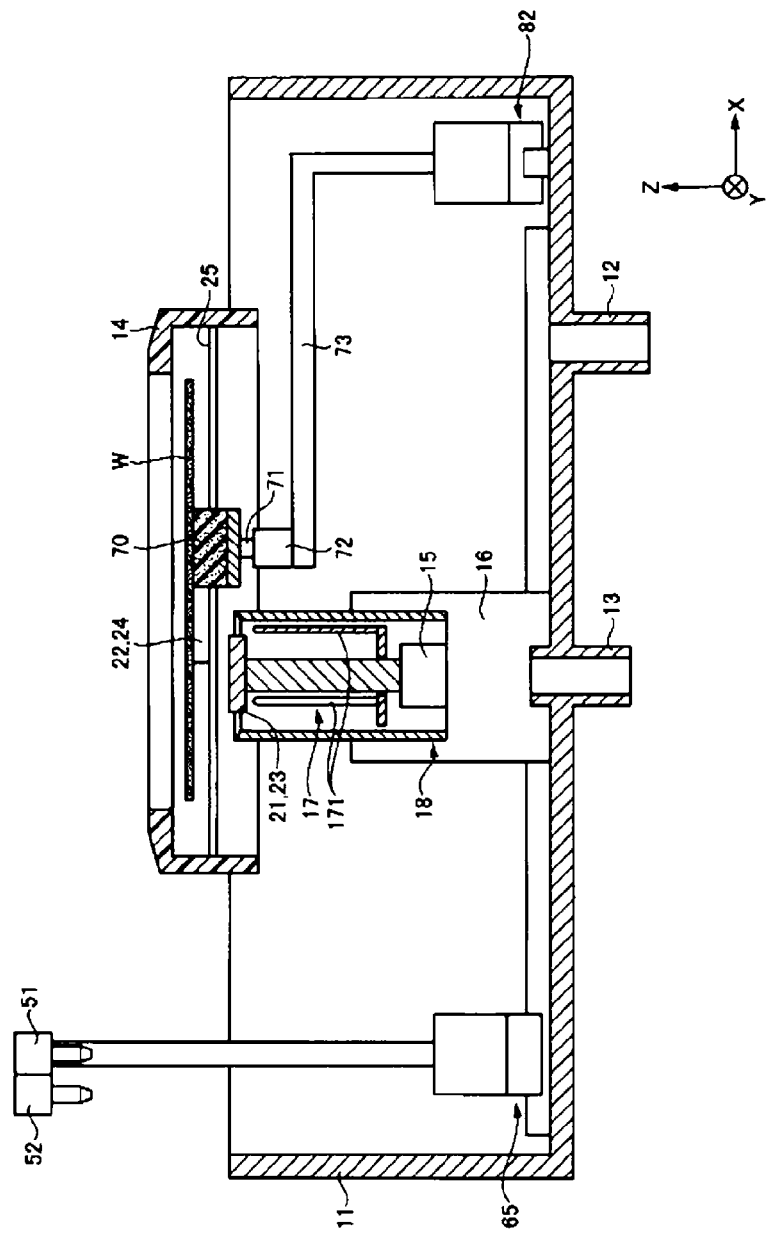
FIG. 7A is a cross-sectional view illustrating the substrate processing apparatus at the time when S21 of FIG. 4 is started.
Figure 7B:
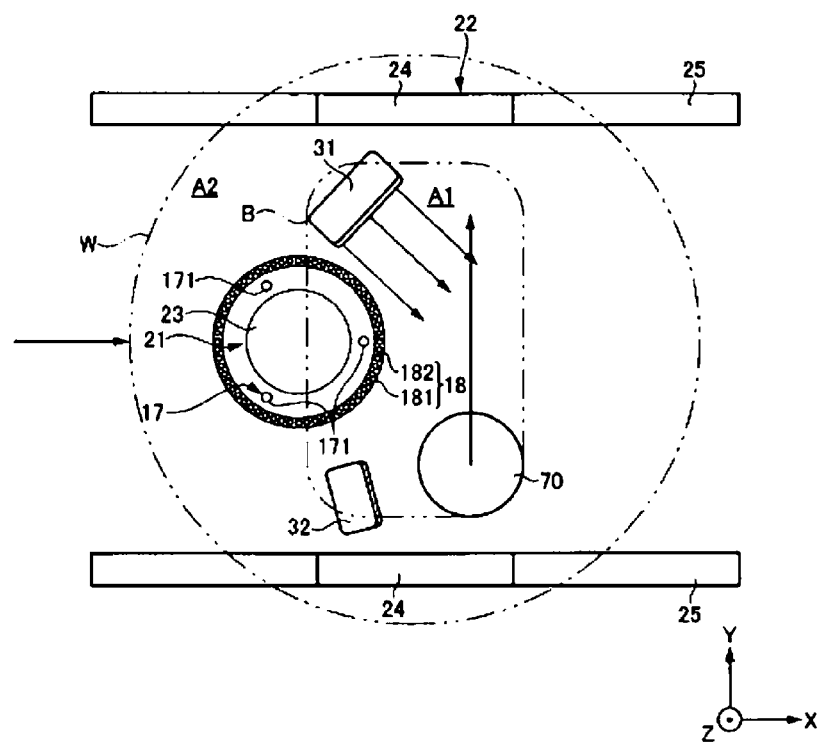
FIG. 7B is a plan view illustrating a portion of FIG. 7A when viewed through the substrate.
Figure 8A:
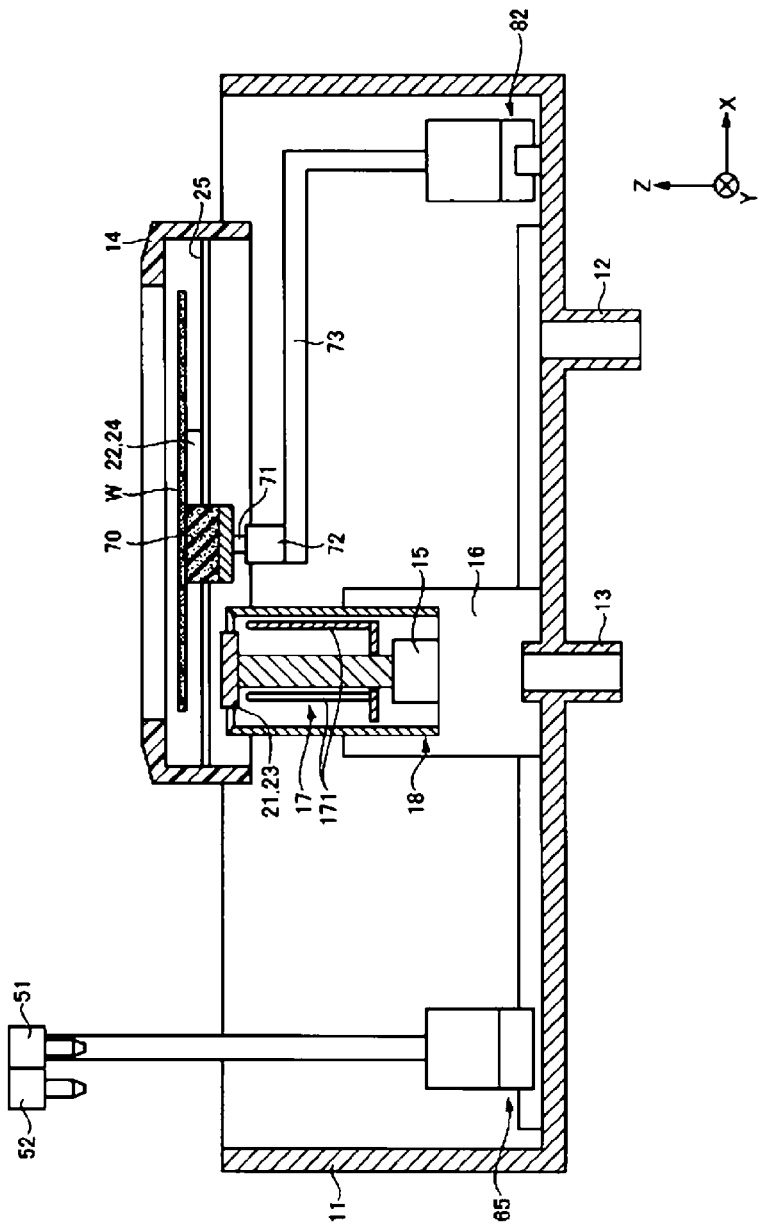
FIG. 8A is a cross-sectional view illustrating the substrate processing apparatus at the time when S21 of FIG. 4 is completed.
Figure 8B:
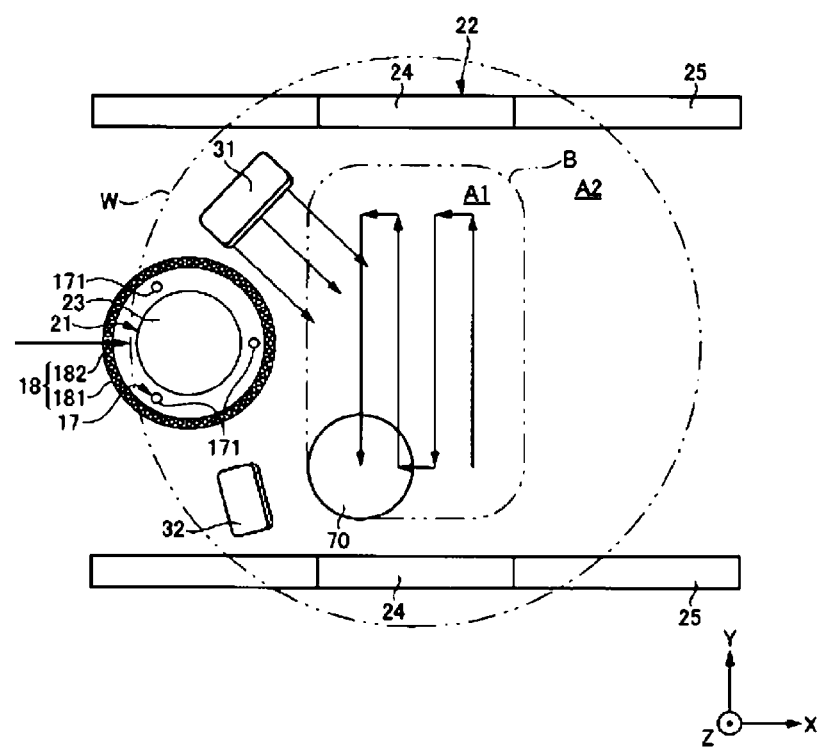
FIG. 8B is a plan view illustrating a portion of FIG. 8A when viewed through the substrate.

In S21 for the chemical liquid processing, the controller 90 controls the movement unit 80 and the liquid supply 30 to move the contact position of the friction body 70 on the lower surface of the substrate W within the first area A1 during the supply of the chemical liquid as illustrated in FIGS. 7B and 8B. Further, in S21 for the chemical liquid processing, the controller 90 controls the rotation motor 72 to rotate the friction body 70.

The controller 90 alternatively repeats moving the second holder 22 in the X-axis positive direction to move the contact position of the friction body 70 in the X-axis negative direction, and moving the friction body 70 in the Y-axis positive or negative direction. The movement route of the rotation center of the friction body 70 is a zigzag trajectory as illustrated in FIG. 8B.

In S21 for the chemical liquid processing, the second holder 22 is moved in the X-axis positive direction as described above. The X-axis positive direction is a direction in which the center of the substrate W held by the second holder 22 moves away from the center of the first holder 21. As compared with a case where the second holder 22 is first moved in the X-axis positive direction before the scrubbing is performed, and then, the scrubbing is performed while moving the second holder 22 in the X-axis negative direction as in the related art, unnecessary operations may be omitted so that the processing time may be reduced.

The relay member 17 is disposed around the spin chuck 23. Accordingly, the second holder 22 receives the substrate W at a position where the center line of the spin chuck 23 and the center of the substrate W coincide with each other as illustrated in FIG. 6A. Thus, after the reception of the substrate W, the movement direction of the second holder 22 in the X-axis direction first follows the X-axis positive direction. Accordingly, in S21 for the chemical liquid processing, the second holder 22 is moved in the X-axis positive direction.

According to the present embodiment, since the scrubbing is performed while moving the second holder 22 in the X-axis positive direction, the drying of the chemical liquid that adheres to the substrate W may be suppressed, as compared with a case where the scrubbing is performed while moving the second holder 22 in the X-axis negative direction as in the related art. Since the X-axis positive direction is the direction in which the center of the substrate W moves away from the center of the first holder 21, the X-axis positive direction indicates a direction in which the first area A1 moves away from the gas ejection ring 18. Since the first area A1 moves away from the gas curtain, the drying of the chemical liquid that adheres to the substrate W may be suppressed, and the generation of particles may be suppressed.

Meanwhile, when the gas ejection ring 18 does not form the gas curtain during the supply of the chemical liquid, the drying of the chemical liquid that adheres to the substrate W may be suppressed. However, since the gas curtain is not formed, the chemical liquid may be applied to the spin chuck 23. According to the present embodiment, since the gas ejection ring 18 forms the gas curtain during the supply of the chemical liquid, the spin chuck 23 may be protected from the chemical liquid.

Figure 9:
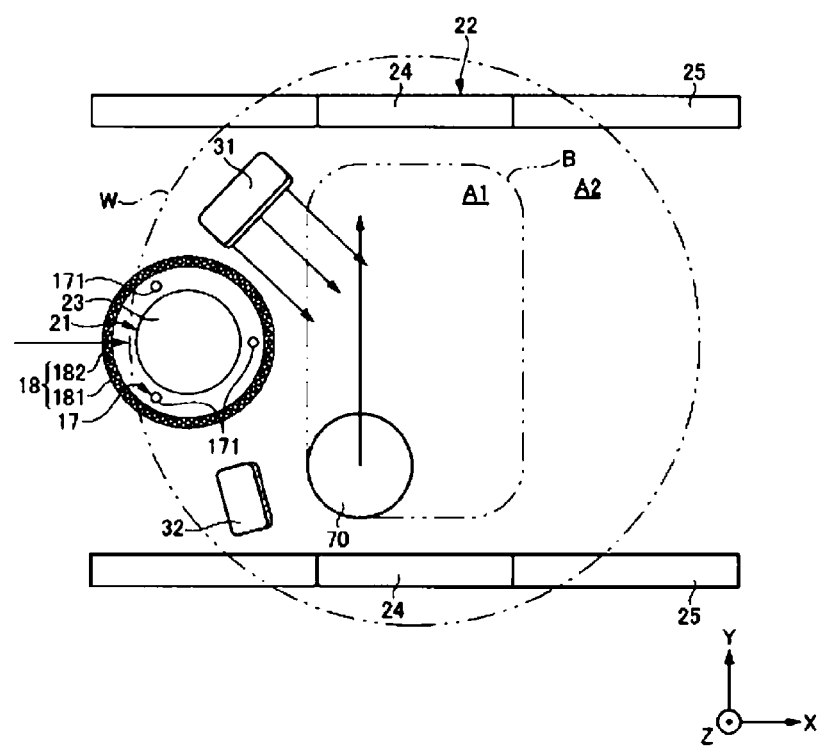
FIG. 9 is a plan view illustrating a portion of the substrate processing apparatus at the time when S22 of FIG. 4 is started, when viewed through the substrate.
Figure 10:
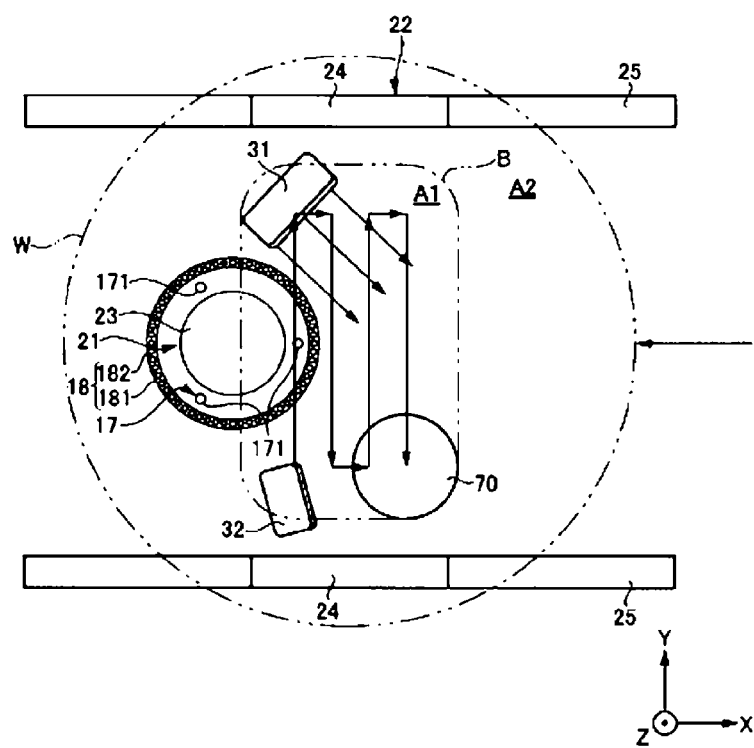
FIG. 10 is a plan view illustrating a portion of the substrate processing apparatus at the time when S22 of FIG. 4 is completed, when viewed through the substrate.
Figure 11:
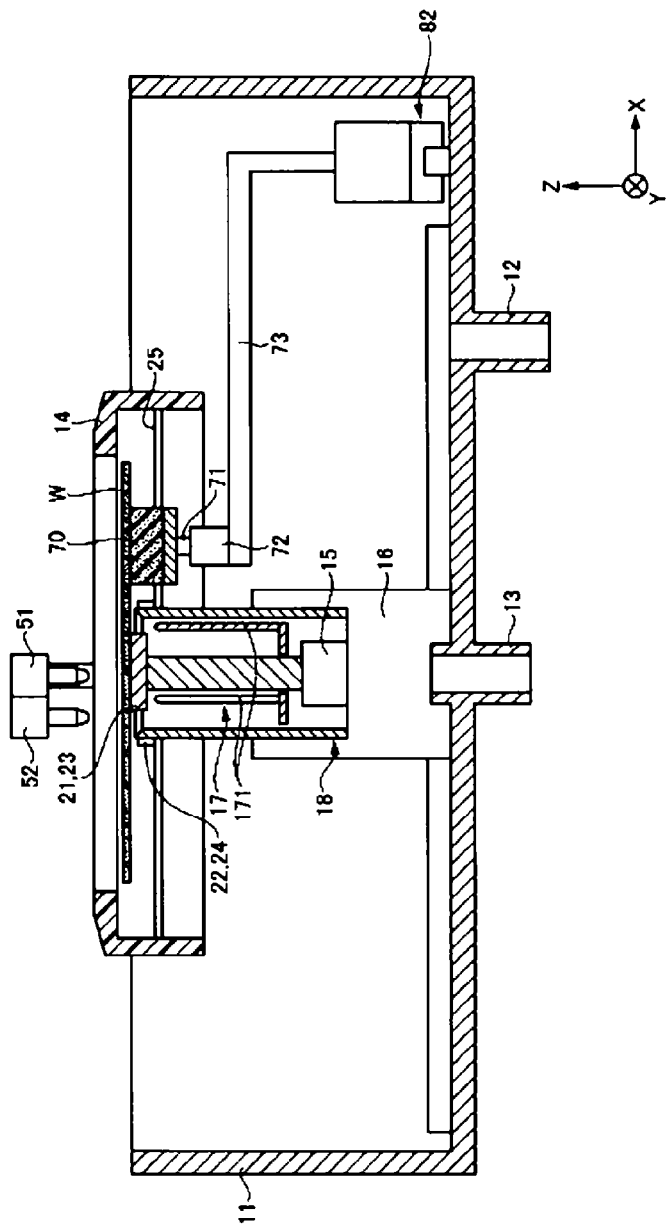
FIG. 11 is a cross-sectional view illustrating the substrate processing apparatus at the time when S4 of FIG. 3 is started.

In S22 for the rinsing liquid processing, the controller 90 controls the movement unit 80 and the liquid supply 30 to move the contact position of the friction body 70 on the lower surface of the substrate W within the first area A1 during the supply of the rinsing liquid as illustrated in FIGS. 9 and 10. Further, in S22 for the rinsing liquid processing, the controller 90 controls the rotation motor 72 to rotate the friction body 70.

The controller 90 alternatively repeating moving the second holder 22 in the X-axis negative direction to move the contact position of the friction body 70 in the X-axis positive direction, and moving the friction body 70 in the Y-axis positive or negative direction. The movement route of the rotation center of the friction body 70 is a zigzag trajectory as illustrated in FIG. 10.

In S21 for the chemical liquid processing and S22 for the rinsing liquid processing, the contact position of the friction body 70 moves in the X-axis direction, but the movement directions thereof are opposite to each other. Since the contact position of the friction body 70 may not be moved after S21 for the chemical liquid processing and before S22 for the rinsing liquid processing, unnecessary operations may be omitted so that the processing time may be reduced. This effect is obtained when the movement directions of the contact position of the friction body 70 in the X-axis direction are opposite to each other in S21 for the chemical liquid processing and S22 for the rinsing liquid processing.

In S22 for the rinsing liquid processing, the second holder 22 is moved in the X-axis negative direction as described above. The X-axis negative direction is a direction in which the center of the substrate W held by the second holder 22 approaches the center of the first holder 21. Accordingly, the operation required for aligning the second holder 22 and the first holder 21 after S22 for the rinsing liquid processing and before S3 for the holding/replacement may be reduced, and the time for processing the substrate W may be reduced.

In S3 for the holding/replacement, the controller 90 performs a transfer of the substrate W from the second holder 22 to the first holder 21. First, the first movement unit 81 moves the second holder 22 in the X-axis negative direction to align the center of the substrate W held by the second holder 22 and the center of the first holder 21 with each other. Subsequently, the lifting mechanism 19 moves the second holder 22 down to place the substrate W on the first holder 21. At that time, the second holder 22 releases the adsorption/holding of the substrate W, and the first holder 21 adsorbs and holds the first area A1 of the lower surface of the substrate W.

Instead of causing the lifting mechanism 19 to move the second holder 22 down, the lifting mechanism 16 may move the first holder 21 up to perform the transfer of the substrate W from the second holder 22 to the first holder 21. In any case, since the second area A2 of the lower surface of the substrate W may be processed after S3 for the holding/replacement, and the first area A1 of the lower surface of the substrate W may be processed before S3 for the holding/replacement, the entire lower surface of the substrate W may be processed.

Figure 5:
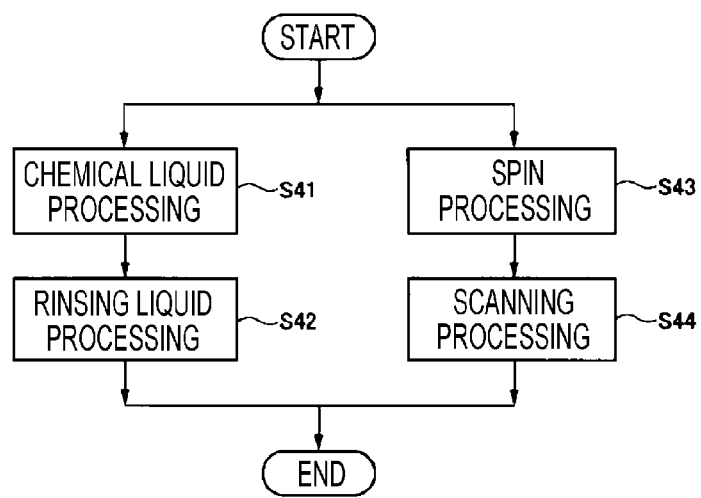
FIG. 5 is a flowchart illustrating an example of S4 of FIG. 3.

In S4 for the both-side processing, the second area A2 of the lower surface of the substrate W and the entire upper surface of the substrate W are processed. The processing of the second area A2 of the lower surface includes S41 for a chemical liquid processing and S42 for a rinsing liquid processing as illustrated in FIG. 5. The processing of the entire upper surface includes S43 for a spin processing and S44 for a scanning processing as illustrated in FIG. 5. During the processing of the second area A2 of the lower surface, a portion of the first area A1 of the lower surface may be processed. The first holder 21 and the friction body 70 are required not to interfere with each other.

In S41 for the chemical liquid processing, in a state where the first holder 21 holds the substrate W, and the rotation mechanism 15 rotates the first holder 21, the controller 90 controls the liquid supply 30 and the second movement unit 82 to move the contact position of the friction body 70 over the entire second area A2 during the supply of the chemical liquid. The contact position of the friction body 70 may come out from the second area A2 into the first area A1 while moving over the entire second area A2. The second movement unit 82 gradually moves the contact position of the friction body 70 outward in the diameter direction of the substrate W. Further, in S41 for the chemical liquid processing, the controller 90 controls the rotation motor 72 to rotate the friction body 70.

In S42 for the rinsing liquid processing, in a state where the first holder 21 holds the substrate W, and the rotation mechanism 15 rotates the first holder 21, the controller 90 controls the liquid supply 30 and the second movement unit 82 to move the contact position of the friction body 70 over the entire second area A2 during the supply of the rinsing liquid. The contact position of the friction body 70 may come out from the second area A2 into the first area A1 while moving over the entire second area A2. The second movement unit 82 gradually moves the contact position of the friction body 70 outward in the diameter direction of the substrate W. Further, in S42 for the rinsing liquid processing, the controller 90 controls the rotation motor 72 to rotate the friction body 70.

In S43 for the spin processing, the rotation mechanism 15 rotates the substrate W together with the spin chuck 23, and the upper nozzle 51 supplies the processing liquid to the center of the upper surface of the substrate W. The processing liquid wets and spreads over the entire upper surface of the substrate W by the centrifugal force, and causes dirt separated from the substrate W to flow outward in the diameter direction of the substrate W. As the processing liquid, for example, a rinsing liquid such as DIW is used. As the processing liquid, the chemical liquid and the rinsing liquid may be used in an order.

The rotation mechanism 15 rotates the spin chuck 23 at a relatively low speed, so as to prevent the residual liquid on the lower surface of the substrate W from flowing around the peripheral edge of the substrate W toward the upper surface of the substrate W due to the centrifugal force. The controller 90 controls the number of times of rotating the spin chuck 23 and the amount of the processing liquid supplied from the upper nozzle 51, so as to form the liquid film of the processing liquid on the entire upper surface of the substrate W before the residual liquid on the lower surface of the substrate W reaches the peripheral edge of the substrate W.

The controller 90 performs a beveling processing on the substrate W during the low-speed rotation of the spin chuck 23. In the beveling processing on the substrate W, a friction body such as a brush or sponge (not illustrated) is pressed against the peripheral edge of the substrate W to rub the peripheral edge of the substrate W. The controller 90 completes the beveling processing on the substrate W during the low-speed rotation of the spin chuck 23, and separates the friction body from the peripheral edge of the substrate W. Since the centrifugal force is small during the low-speed rotation so that the velocity of droplets scattered from the peripheral edge of the substrate W is small, it is possible to suppress a liquid splashing caused from a collision between the droplets and the friction body.

In S44 for the scanning processing, the rotation mechanism 15 rotates the substrate W together with the spin chuck 23, the upper nozzle 52 supplies the processing liquid to the center of the upper surface of the substrate W, and the movement device 65 moves the upper nozzle 52 outward in the diameter direction of the substrate W from the inner position in the diameter direction of the substrate W. The dirt separated from the substrate W flows outward in the diameter direction of the substrate W.

The upper nozzle 52 gradually moves from the position directly above the center of the substrate W to the position directly above the peripheral edge of the substrate W while ejecting the processing liquid toward the upper surface of the substrate W, and is stopped at the position directly above the peripheral edge of the substrate W for a set time. This is because dirt easily adheres to the peripheral edge of the substrate W. According to the present embodiment, dirt that adheres to the peripheral edge of the substrate W may be removed.

The upper nozzle 52 moves outward in the diameter direction of the substrate W in the present embodiment, but may move inward in the diameter direction of the substrate W. The number of times of the scanning of the upper nozzle 52 is one in the present embodiment, but may be two or more.

In S44 for the scanning processing, the controller 90 increases the number of times of rotating the spin chuck 23 to rotate the spin chuck 23 at a relatively high speed, as compared with S43 for the spinning processing. When the upper nozzle 52 is moved in the diameter direction of the substrate W, the upper nozzle 52 may spray the processing liquid over the entire substrate W in the circumferential direction of the substrate W.

The upper nozzle 52 is, for example, a two-fluid nozzle, and pulverizes the processing liquid into fine particles with a gas such as $N_2$ gas, and sprays the particles. The processing efficiency of the processing liquid may be improved. The upper nozzle 52 sprays only the gas before spraying a mixed fluid of the gas and the processing liquid. The processing liquid may be reliably pulverized, and the liquid splashing may be suppressed when the processing liquid collides with the substrate W.

In S5 for the drying, the spin chuck 23 is rotated at a relatively high speed to scatter off the processing liquid adhering to the substrate W. Then, the substrate W is transferred to the outside of the substrate processing apparatus 10. Then, the processing on the substrate W ends.

According to an aspect of the present disclosure, the operations of the substrate processing apparatus may be reduced, and the time required for a processing on the substrate may be reduced.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
a first holder configured to absorb and hold a first area of a substrate and a second holder configured to absorb and hold a second area of the substrate;
a liquid supply configured to sequentially supply a first processing liquid and a second processing liquid different from the first processing liquid, to a main surface of the substrate held by the first holder and the second holder;
a friction body configured to come into contact with and rub the main surface of the substrate during the supply of the first processing liquid and the second processing liquid;
a first mover configured to move the second holder in a first axial direction that is parallel to the main surface of the substrate and a second mover configured to move the friction body in a second axial direction that is parallel to the main surface of the substrate and perpendicular to the first axial direction; and
a controller configured to control an overall operation of the substrate processing apparatus,
wherein the controller is programmed to:
in a state where the second holder holds the substrate and the friction body contacts the substrate, control the first mover to first move the second holder in a one-side direction of the first axial direction during the supply of the first processing liquid while controlling the second mover to move the friction body along the second axial direction, and second move the second holder in an other-side direction of the first axial direction during the supply of the second processing liquid that is subsequent to the supply of the first processing liquid while controlling the second mover to move the friction body along the second axial direction.

2. The substrate processing apparatus according to claim 1, wherein the first holder and the second holder come into contact with the main surface of the substrate.

3. The substrate processing apparatus according to claim 2, wherein
the main surface of the substrate is a lower surface of the substrate,
the first area includes a center of the lower surface of the substrate, and the second area includes a peripheral edge of the lower surface of the substrate and is in contact with a peripheral edge of the first area, and
wherein the controller moves a contact position of the friction body in the other-side direction of the first axial direction within the first area during the supply of the first processing liquid in the first move, and moves the contact position of the friction body in the one-side direction of the first axial direction within the first area during the supply of the second processing liquid that is subsequent to the supply of the first processing liquid in the second move.

4. The substrate processing apparatus according to claim 3, further comprising:
a relay configured to move up and down around the first holder to receive the substrate from an external transfer device and pass the received substrate to the second holder,
wherein
the controller moves the second holder in a direction in which a center of the substrate moves away from a center of the first holder during the supply of the first processing liquid in the first move, and moves the second holder in a direction in which the center of the substrate approaches the center of the first holder during the supply of the second processing liquid in the second move.

5. The substrate processing apparatus according to claim 4, further comprising:
a gas ejection ring configured to form a gas curtain in an annular shape around the first holder toward the lower surface of the substrate during the supply of the first processing liquid.

6. The substrate processing apparatus according to claim 5, further comprising:
a lift configured to relatively move the first holder and the second holder up and down to deliver the substrate from the second holder to the first holder; and
a rotator configured to rotate the first holder,
wherein in a state where the first holder holds the substrate, and the rotator rotates the first holder, the controller controls the liquid supply and the second mover to move the contact position of the friction body over an entire second area during the supply of the first processing liquid.

7. The substrate processing apparatus according to claim 6, wherein the liquid supply includes an upper nozzle configured to supply a processing liquid to an upper surface of the substrate, and
the controller controls the liquid supply to supply a processing liquid to the upper surface of the substrate while moving the contact position of the friction body over the entire second area.

8. The substrate processing apparatus according to claim 4, further comprising:
a lift configured to relatively move the first holder and the second holder up and down to deliver the substrate from the second holder to the first holder; and
a rotator configured to rotate the first holder,
wherein in a state where the first holder holds the substrate, and the rotator rotates the first holder, the controller controls the liquid supply and the second mover to move the contact position of the friction body over an entire second area during the supply of the first processing liquid.

9. The substrate processing apparatus according to claim 8, wherein the liquid supply includes an upper nozzle configured to supply a processing liquid to an upper surface of the substrate, and
the controller controls the liquid supply to supply a processing liquid to the upper surface of the substrate while moving the contact position of the friction body over the entire second area.

10. The substrate processing apparatus according to claim 9, wherein the liquid supply includes an ejection hole of a chemical liquid that is the first processing liquid and an ejection hole of a rinsing liquid that is the second processing liquid, and
the ejection hole of the chemical liquid is disposed below the ejection hole of the rinsing liquid.

11. The substrate processing apparatus according to claim 1, wherein the liquid supply includes an ejection hole of a chemical liquid that is the first processing liquid and an ejection hole of a rinsing liquid that is the second processing liquid, and the ejection hole of the chemical liquid is disposed below the ejection hole of the rinsing liquid.

12. A substrate processing method comprising:

providing a first holder configured to absorb and hold a first area of a substrate and a second holder configured to absorb and hold a second area of the substrate;

holding the second area of the substrate by the second holder;

sequentially supplying a first processing liquid and a second processing liquid different from the first processing liquid to a main surface of the substrate;

rubbing the main surface of the substrate with a friction body in contact with the main surface of the substrate; and moving a contact position of the friction body on the main surface of the substrate in a first axial direction and a second axial direction that are parallel to the main surface of the substrate and perpendicular to each other, wherein the moving the contact position of the friction body includes first moving the second holder in one-side direction of the first axial direction during the supply of the first processing liquid while moving the friction body along the second axial direction, and second moving the second holder in an other-side direction of the first axial direction during the supply of the second processing liquid that is subsequent to the supply of the first processing liquid while moving the friction body along the second axial direction.

13. The substrate processing method according to claim 12, further comprising bringing the first holder and the second holder into contact with the main surface of the substrate.

14. The substrate processing method according to claim 13, wherein the main surface of the substrate is a lower surface of the substrate, the first area includes a center of the lower surface of the substrate, and the second area includes a peripheral edge of the lower surface of the substrate and is in contact with a peripheral edge of the first area, and in the first moving a contact position of the friction body is moved in the other-side one side direction of the first axial direction within the first area during the supply of the first processing liquid, and in the second moving, the contact position of the friction body is moved in the one-side direction of the first axial direction within the first area during the supply of the second processing liquid that is subsequent to the supply of the first processing liquid.

15. The substrate processing method according to claim 14, further comprising:

receiving the substrate from an external transfer device and passing the received substrate to the second holder, by a relay that moves up and down around the first holder; and in the first moving, moving the second holder in a direction in which a center of the substrate moves away from a center of the first holder during the supply of the first processing liquid, and in the second moving, moving the second holder in a direction in which the center of the substrate approaches the center of the first holder during the supply of the second processing liquid.

16. The substrate processing method according to claim 15, further comprising:

forming a gas curtain in an annular shape around the first holder toward the lower surface of the substrate during the supply of the first processing liquid.

17. The substrate processing method according to claim 16, further comprising:

relatively moving the first holder and the second holder up and down to deliver the substrate from the second holder to the first holder; and in a state where the first holder holds the substrate and is rotated, moving the contact position of the friction body over an entire second area during the supply of the first processing liquid.

18. The substrate processing method according to claim 17, further comprising:

supplying a processing liquid to an upper surface of the substrate, while moving the contact position of the friction body over the entire second area.

19. The substrate processing method according to claim 15, further comprising:

relatively moving the first holder and the second holder up and down to deliver the substrate from the second holder to the first holder; and in a state where the first holder holds the substrate and is rotated, moving the contact position of the friction body over an entire second area during the supply of the first processing liquid.

\* \* \* \* \*